United States Patent [19]

Soberay et al.

[11] Patent Number: 4,666,551
[45] Date of Patent: May 19, 1987

[54] VACUUM PRESS

[76] Inventors: Thaddeus Soberay, 8607 Hinckley Cir., Brecksville, Ohio 44141; Ronald T. Soberay, 225 SouthBay Dr., Akron, Ohio 44319

[21] Appl. No.: 745,844

[22] Filed: Jun. 17, 1985

[51] Int. Cl.$^4$ .................. B30B 15/00; E05D 15/58; F27D 3/00; F27D 7/00

[52] U.S. Cl. ............................. 156/382; 49/254; 49/258; 156/228; 156/286; 156/288; 156/312; 156/580; 156/497; 432/242

[58] Field of Search ............... 156/288, 228, 285, 286, 156/312, 382, 580, 582, 497; 432/242; 49/235, 254–259

[56] References Cited

U.S. PATENT DOCUMENTS

| | | |
|---|---|---|
| 3,240,647 | 3/1966 | Morgan . |
| 3,267,517 | 8/1966 | Altermatt . |
| 3,573,126 | 3/1971 | Kougel .................. 156/286 |
| 3,616,014 | 10/1971 | Weglin . |
| 3,625,496 | 12/1971 | Borner .................. 432/242 |
| 3,713,944 | 1/1973 | Dennis et al. . |
| 3,768,203 | 10/1973 | Belluci .................. 49/254 |
| 3,838,538 | 10/1974 | Burford .................. 49/258 |
| 4,028,042 | 6/1977 | Goodfellow et al. . |
| 4,053,266 | 10/1977 | Friedrichs et al. . |
| 4,127,436 | 11/1978 | Friel . |
| 4,396,451 | 8/1983 | Yeager . |
| 4,417,864 | 11/1983 | Shigeo et al. . |
| 4,432,828 | 2/1984 | Siempelkamp et al. . |
| 4,521,172 | 6/1985 | Gilbert . |

FOREIGN PATENT DOCUMENTS

| | | |
|---|---|---|
| 534177 | 9/1931 | Fed. Rep. of Germany ........ 49/258 |
| 465332 | 8/1951 | Italy .................. 156/288 |
| 316134 | 10/1930 | United Kingdom .............. 156/286 |
| 1603844 | 12/1981 | United Kingdom . |
| 1603845 | 12/1981 | United Kingdom . |

Primary Examiner—Jerome Massie
Attorney, Agent, or Firm—Watts, Hoffmann, Fisher & Heinke Co.

[57] ABSTRACT

A laminating apparatus for bonding a plurality of substrates to form a unitary laminated product such as a printed circuit board. The machine includes a frame defined by a pair of parallel, spaced vertical side plates and upper and lower load bearing cross beams extending between said side plates. The frame defines a processing chamber including front and rear openings by which access to the chamber is provided. A plurality of platen assemblies are positioned within the chamber and front and rear doors are sealingly engageable with the frame to seal the chamber from atmosphere. One door is hingedly connected to the frame whereas the other door forms part of a door assembly that includes a trackway pivotally mounted to the processing unit for movement between adjacent and spaced positions. The other door is slidable along the trackway and is driven by a fluid pressure operated actuator. When movement in the door is desired, the trackway is pivoted to the spaced position whereby the other door disengages the frame and is allowed to move to an open position at which its associated chamber access opening is exposed. A fluid pressure operated ram is supported by the lower cross beam and is operative to apply a predetermined pressure to the platen assemblies. An evacuation system generates a subatmospheric pressure in the chamber and the heating system raises the temperature of the platen assemblies so that the combination of mechanical pressure, subatmospheric pressure in the chamber and heat cooperate to produce bonding between the individual substrates.

6 Claims, 6 Drawing Figures

VACUUM PRESS

DESCRIPTION

1. Technical Field

The present invention relates generally to platen presses and methods and in particular to an apparatus especially suited for manufacturing multi-layered electronic circuit boards.

2. Background Art

Electronic circuit boards are typically constructed by bonding a plurality of substrates or layers of material together to produce a rigid structure having desired electrical properties. Depending on the application, the individual substrates may be electrically insulating or electrically conductive. A conductive layer usually comprises a relatively thin film of conducting foil such as copper which may define an electrical circuit. Insulating layers are constructed from suitable dielectric or insulating materials.

Circuit boards can be manufactured using: (1) a continuous process which is often employed to make raw or single layered boards; or, (2) a batch process. In a continuous process, rolls of material are coated with resin or other suitable coating and are then brought into intimate contact and allowed to cure. The laminated lengths of material are usually cut into individual boards after the curing process is substantially complete. In a batch process, individual cut sheets of substrate are stacked one atop the other and are bonded together to form the unitary, rigid board.

Batch processes are typically carried out using either a hydraulic press or a pressure vessel. In the first method, the layers of substrates are impregnated with a liquid resin composition or other material, often termed "prepreg". The impregnated layers are then stacked, registered and placed within a pressure platen assembly forming part of the hydraulic press. The stack is then compressed by the platen assembly and heated to an elevated temperature. The combination of pressure and heat softens the prepreg and causes bonding between the individual layers. The high pressures and heat necessary to achieve bonding, if not carefully controlled, can cause problems in the finished product. For example, the high pressure can cause dimensional changes in the boards as well as misregistration between the layers. The heat and pressure if not uniform can also cause warping and twisting in the boards. It has been found that complex, multilayer circuit boards, such as those used for military applications cannot be readily produced using a conventional hydraulic press because an excessive scrap rate makes the process economically disadvantageous.

Efforts have been made to improve the quality of the boards produced by a hydraulic press. One such attempt is the use of vacuum jigs in the hydraulic press. Each platen assembly is mounted within or forms part of a jig so that the boards being pressed are subjected to a subatmospheric pressure. Although the use of jigs can improve the quality of the product, the process is expensive and slow.

The use of a pressure vessel to produce laminated circuit boards reduces the need for high pressure. With this manufacturing technique, the individual layers are placed in a fixture or vacuum bag and sealed from the atmosphere. The bag is connected to a vacuum source and then placed in the pressure vessel. A vacuum is drawn so that the layers are exposed to a subatmospheric pressure during the curing process. The use of the subatmospheric pressure reduces the pressure needed to effect bonding of the layers and therefore it is presumed that less dimensional and registration problems will occur. However, the use of a pressure vessel generates a different set of problems. In most applications, inert gases are needed to control the process. In addition, special expertise is needed in order to operate the vessel. Since heating is achieved by radiation rather than conduction, it is believed that process times are increased.

Since the boards must be first loaded into vacuum bags and then into a pressure vessel, the process is labor intensive and cannot be readily automated. Small production runs to produce a limited number of boards is believed to be uneconomical. Because the pressure applied to the boards is generated by the pressurization of the pressure vessel, and heating of the substrates is achieved through radiation rather than through conduction, precise control of the process is difficult.

DISCLOSURE OF THE INVENTION

The present invention provides a new and improved apparatus for producing heat and pressure produced products such as laminated printed circuit boards. The disclosed apparatus includes the advantages of a hydraulic platen press and vacuum jigs but eliminates or reduces their recognized limitations and provides a machine that is both economical to operate and capable of producing high quality products such as laminations.

The invention is disclosed as part of a laminating machine for manufacturing multi-layer printed curcuit boards. It should be understood that the invention can be used for other applications, such as rubber molding processes and should not be limited to the disclosed application.

In accordance with the preferred embodiment, the apparatus comprises a frame structure including side plates at least partially defining a process chamber. At least one door provides access to the chamber which, when closed, sealingly engages the frame to seal the chamber from atmosphere. At least one platen assembly located within the chamber is movable between open and closed positions and is adapted to receive substrates to be laminated.

In the preferred method of operation, the individual laminations or substrates are placed within the platen assembly. The assembly is then closed and placed under pressure while concurrently being heated. The door is closed to seal the chamber from atmopshere and a vacuum system is energized to evacuate the chamber. The combination of heat, pressure and vacuum effects bonding among the laminations to produce a unitary laminated structure.

Unlike the prior art, the disclosed apparatus eliminates the need for individual vacuum jigs or vacuum bags for the boards. The chamber can be sized to accommodate a plurality of platen assemblies which may comprise conventional platen constructions. By operating the platen assemblies in an evacuated chamber, it has been found that the curing process which ultimately produces the laminated product, can be carried out at a lower platen pressure. Reducing the pressure to which the product is exposed to reduces the chance of warping or twisting of the product, improves registration of the individual layers and reduces the potential for dimensional changes in the product.

Since the chamber in which the platen assemblies are operated is continually being evacuated by a vacuum source, solvents and other by-products released during the curing process can be easily dealt with. If the released solvents or gases are not controlled or removed during the curing process, gas pockets can form in or between the layers and can eventually precipitate a failure in the board. It has been found that the incidence of trapped air pockets or gas bubbles is substantially decreased in products produced with the disclosed apparatus.

In most laminating processes, the substrate is impregnated with a liquid resin composition, often termed "prepreg". It has been found that under some circumstances, the amount of prepreg needed for a given application is reduced by using the disclosed apparatus.

In the preferred and illustrated embodiment, the platen assemblies are heated so that the heat necessary for curing is transferred to the laminations by conduction rather than radiation as is the case with pressure vessel type laminating processes. With the disclosed machine, pressure and temperature can be precisely controlled and varied during the laminating process to suit the application or materials being used.

In the preferred embodiment, the apparatus is fitted with a second access door, spaced from the first door to facilitate and enhance the throughput or production rate for the machine. According to the preferred operating procedure, the materials to be laminated are loaded into the platen assemblies through a front access door which preferably is hingedly connected to the frame structure in a conventional manner. After a laminating cycle, the laminated boards are removed from the platen assemblies through a rear access door, for further processing. For example, the boards may be transferred to a "cool press" to complete the curing process.

According to a feature of the preferred embodiment, the rear access door and associated door opening mechanism are configured to minimize the amount of space needed to effect opening of the machine and unloading of the platen assemblies. In particular, in the illustrated embodiment, a door support structure is pivotally connected to the frame. A door adapted to seal off the rear access opening to the chamber in the laminating apparatus is slidably supported by the door support structure for substantially vertical, reciprocating motion. According to this feature, at the conclusion of a laminating cycle, the door support is pivoted away from the apparatus causing the door to move away from the rear access opening. Once the door is moved to a position sufficient to clear the access opening, a drive mechanism, preferably a fluid pressure operated actuator, is activated to drive the door upwardly thereby providing access to the rear chamber opening. After the platen assemblies are reloaded with material to be laminated, the door is lowered and aligned with the rear opening and the door support is then pivoted towards the apparatus until the rear door sealingly engages the chamber frame.

With the disclosed construction, very little plant space is needed to accommodate the door opening. Consequently ancillary machinery such as a "cool press" can be positioned immediately adjacent the rear opening of the processing chamber thus facilitating transfer of laminated products from the laminating apparatus to the ancillary processing equipment. In the preferred construction, the door support is pivoted between adjacent and spaced positions by a pair of fluid pressure operated acutators mounted to the chamber frame.

The disclosed laminating apparatus can produce complex printed circuit boards in an efficient and reliable manner. It is believed that scrap rate for multilayer boards is substantially reduced as compared to boards produced using prior art methods and apparatus. The apparatus can produce small quantities of specialized printed circuit boards as well as large production quantities of circuit boards for consumer markets, etc.

Additional features of the invention will become apparent and a fuller understanding obtained by reading the following detailed description made in connection with the accompanying drawings.

BEST MODE FOR CARRYING OUT THE INVENTION

Figure 1:
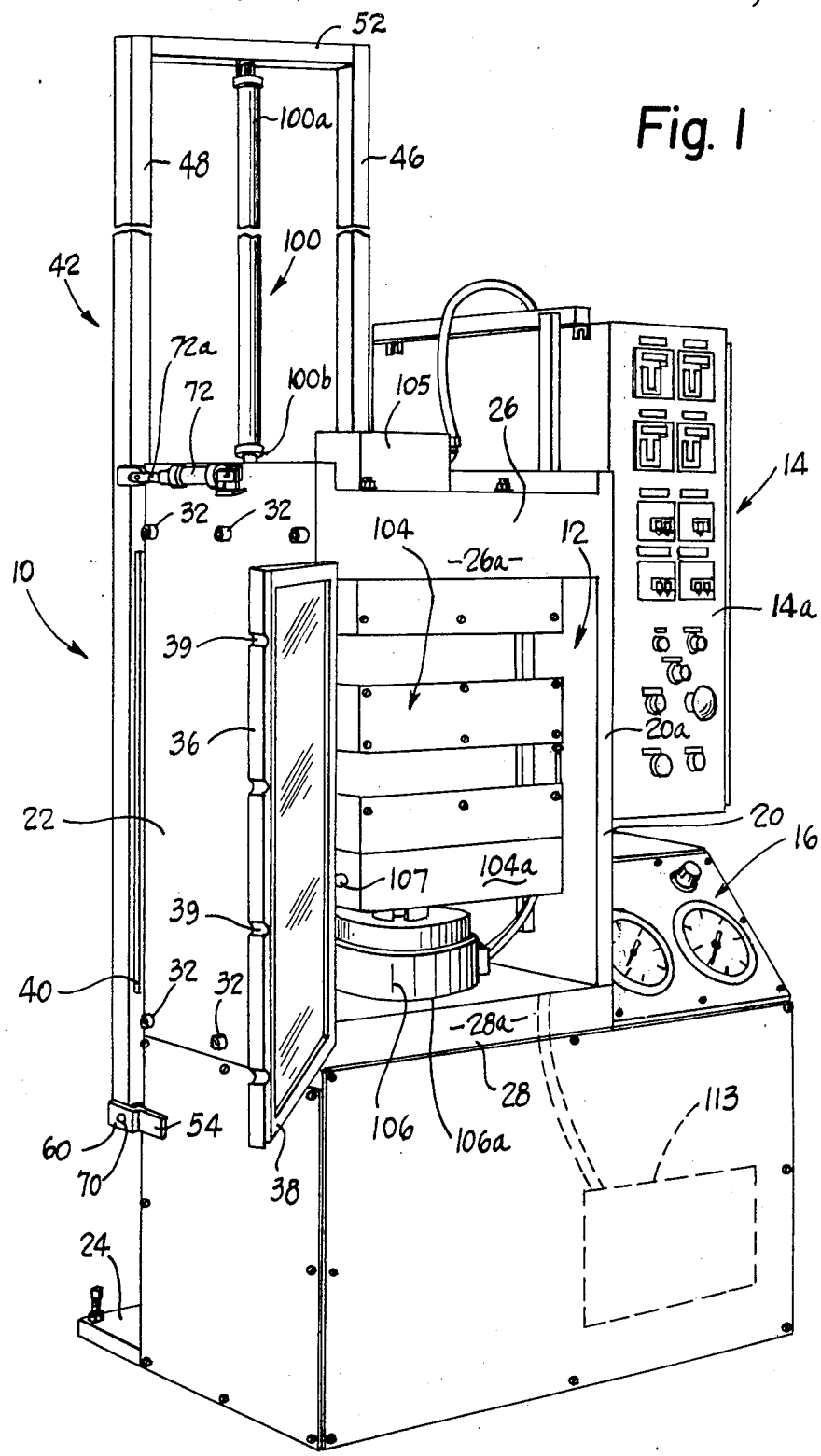
FIG. 1 is a perspective view of a machine embodying the present invention.

FIG. 1 illustrates the overall construction of a laminating machine embodying the present invention. The machine comprises a processing unit, indicated generally by the reference character 10 which includes a processing chamber, indicated generally by the reference character 12. A control box 14 is mounted to one side of the processing unit 10 and houses the electronic control circuitry for controlling the processing unit 10. A front plate 14a of the control box 14 mounts a plurality of operator controls and process indicators. An operator console 16 extending to the right of the processing unit 10 and positioned below the control box 14 mounts additional controls and gauges. The gauges may indicate pressure or temperature conditions in the processing chamber 12.

Figure 2:
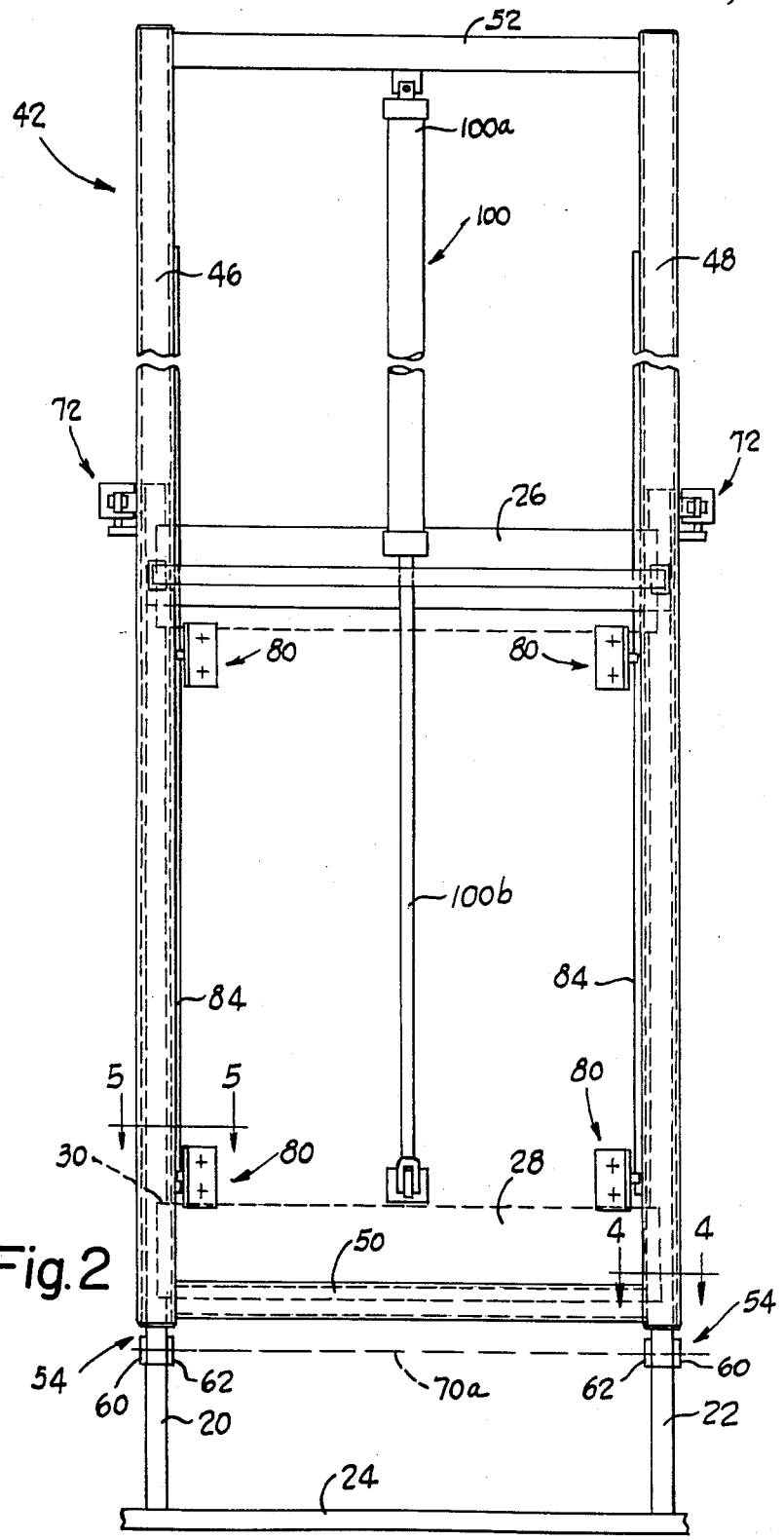
FIG. 2 is a rear view of a portion of the machine shown in FIG. 1.
Figure 3:
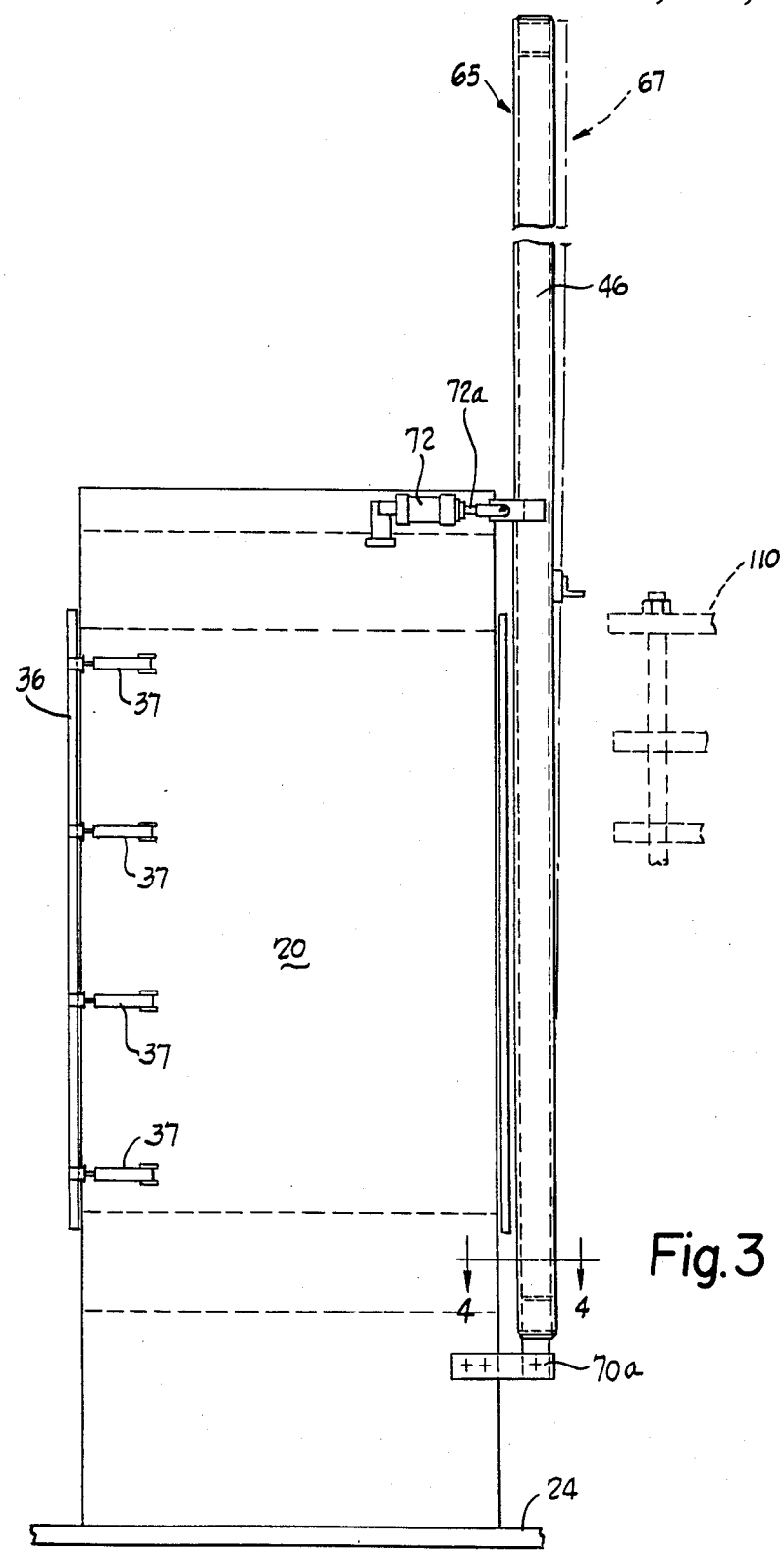
FIG. 3 is a side view of the machine portion shown in FIG. 2.
Figure 4:
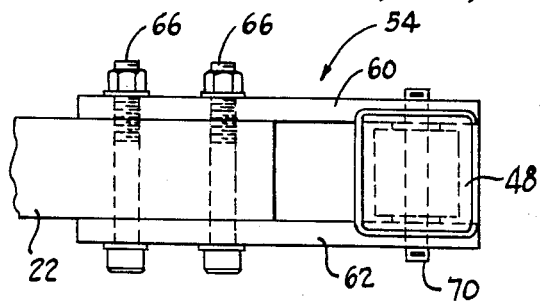
FIG. 4 is a fragmentary, sectional view as seen from the plane indicated by the line 4—4 in FIG. 2.

The processing unit 10 is defined by a frame structure which, as seen in FIGS. 2 and 3, includes a pair of upstanding side plates 20, 22 resting on a base plate 24. Upper and lower load bearing cross beams 26, 28 are supported between the side plates 20, 22. The side plates are notched as at 30 to receive the ends of the cross beams. A plurality of bolts 32, shown only in FIG. 1, extend through the side plates and are threadedly received by the cross beams 26, 28 and clamp the side plates 20, 22 and cross beams together to form a rigid structure.

The processing chamber 12 is defined by a region enclosed by the side plates 20, 22 and the cross beams 26, 28. As seen in FIG. 1, an access door 36 is hingedly connected to the side plate 22 by a hinge 35 and closes off the front of the process chamber 12. A peripheral seal 38 is mounted to the door and adapted to sealingly engage faces 26a, 28a, 20a, 22a of the cross beams 26, 28 and the side plates 20, 22, respectively, to prevent air leakage into the chamber 12. A plurality of latches 37 mounted to the outside of the side plate 20 (shown best in FIG. 3) are engageable with notches 39 on the door 36 and are operative to lock the access door 36 in the closed position.

Access to the process chamber 12 through a rear chamber opening is controlled by a rear access door 40. Although the rear access door 40 can be hingedly connected to the side plate 22 or the side plate 24, in the preferred embodiment, the door 40 is carried by a door support indicated generally by the reference character 42 in FIG. 1.

Referring also to FIGS. 2-5, the door support 42 comprises a pair of spaced apart, parallel, box channels 46, 48 interconnected by cross pieces 50, 52. The box channels 46, 48 and cross pieces 50, 52 form a substantially rigid rectangular construction and define a trackway by which the rear access door 40 is slidably carried. The channels 46, 48 are pivotally connected at their lower ends to the side plates 20, 22 by pivot mounts 54, the construction of which is illustrated in detail in FIG. 4. The pivot mount 54 comprises a pair of support plates 60, 62 secured to the side plate 22 by a pair of through bolts 66 (shown only in FIG. 4). The support plates 60, 62 extend rearwardly from the side plate 22 and support a pivot pin 70 by which the box channel 48 is pivotally connected. The door frame 42 is pivoted between a closed position, indicated by the solid line 65 in FIG. 3 and an open position indicated by the phantom line 67 in FIG. 3 about a pivot axis 70a (see FIG. 3) defined by the pivot pin 70. Movement in the door frame is effected through a pair of actuators 72 which as seen best in FIG. 2 are mounted to the upper regions of the side plates 20, 22. The actuators include actuating rods 72a connected to associated box channels 46, 48 which, upon extension, pivot the door support 42 away from the processing unit 10.

Figure 5:
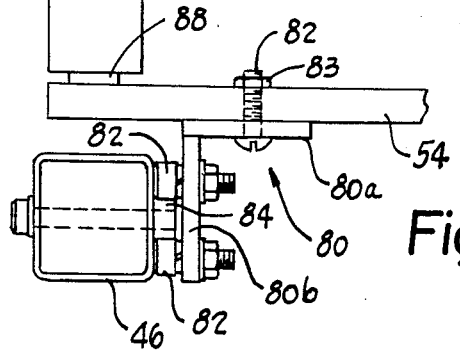
FIG. 5 is a fragmentary sectional view as seen from the plane by the line 5—5 in FIG. 2; and, FIG. 6 is a fragmentary, top view of the machine portion shown in FIG. 2, with parts omitted for clarity.
Figure 6:
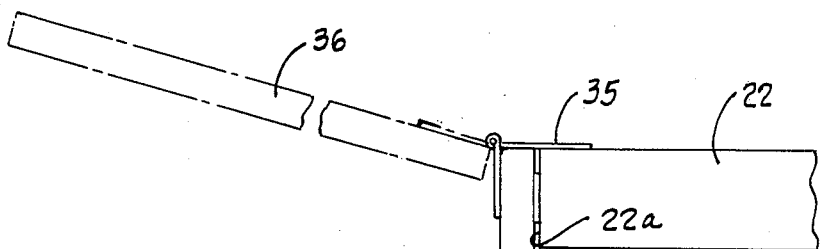
Figure 6:
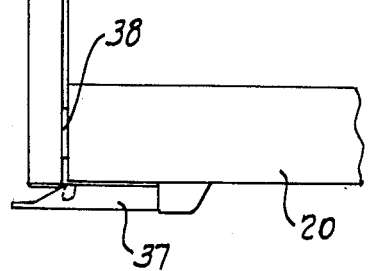

As seen in FIG. 5, the rear access door 40 includes angle brackets 80 by which the door is coupled to the door support structure. Each bracket 80 is anchored to the back of the door 40 by a bolt 82 which extends through a leg 80a of the angle bracket 80 and the door 40 to threadedly receive a nut 83. Another leg 80b of the angle bracket 80 mounts a pair of spaced rollers 82. The rollers 82 ride on either side of a track 84 which is secured to the side of each box channel 46, 48.

Like the door 36, the door 40 includes a peripheral seal 88 to sealingly engage rear faces of the side plates 20, 22 and the cross beams 26, 28. The tracks 84 support the door 40 for rectilinear, reciprocating motion. Movement in the door 40 between closed and opened positions is effected by a fluid pressure operated actuator 100 connected to a lower region of the door.

Referring in particular to FIG. 2, a cylinder end 100a of the actuator 100 depends downwardly from the cross piece 52 and includes an extension rod 100b pivotally connected to the door 40. It should be apparent that the retraction of the extension rod 100b raises the door 40 upwardly along the tracks 84 whereas extension of the rod lowers the door.

It should be apparent that clearance between the door 40 and the rear face of the processing unit 10 must be provided in order to permit relative movement between the door and the frame. The door 40 must also sealingly engage the rear face of the chamber during a processing cycle.

In accordance with the invention, the necessary clearance between the door 40 and the processing unit 10 during door movement is provided by pivoting the door frame 42 rearwardly, away from the processing unit 10, to separate the door 40 from the unit 10. After separation, the actuator 100 is energized to raise the door. When closure of the chamber is desired, the door 40 is driven to its downward position and then the door frame actuators 72 are retracted to pull the door frame 42 towards the processing unit thereby causing the sealing engagement between the door seal 88 and the processing unit 10.

With the preferred construction very little plant room is needed in order to gain access to the chamber 12. As seen in FIG. 3, ancillary processing equipment such as a "cool press" indicated in phantom by reference character 110 can be placed immediately adjacent the rear of the processing chamber. When product is to be transferred from the chamber to the cool press, the door frame actuators 72 are energized to pivot the door support structure 42 to the position indicated in phantom thereby releasing the sealing engagement between the door 40 and the processing unit 10. Once released, the actuator 100 is energized to raise the door 40 upwardly to allow access to the processing chamber 12. Product can then be transferred directly from the chamber 12 to the cool press 110.

Returning to FIG. 1, the processing chamber 12 houses a plurality of platen assemblies 104, which may be of conventional construction. As is known, the assemblies are movable between opened and closed positions. Laminations are produced by placing the substrates to be bonded within a given platen assembly. The assembly is then closed, heated and placed under pressure. In the disclosed apparatus, pressure is applied to the platen assemblies by a fluid pressure operated actuator 106. In particular, a ram 106a mounted to the lower cross beam 28 and extending therethrough, exerts pressure on the bottom of the lowest platen assembly 104a and in effect clamps the platen assemblies 104 between itself and the upper cross beam 26. Platen closure is monitored by a sensor assembly 105 which may include a limit switch (not shown). The switch, which forms part of the control system, is actuated when the press is closed and initiates a process cycle.

The platen assemblies are heated by a heating system (not shown) which may comprise a fluid jacket mounted within the assembly through which a heated fluid is circulated. Heated fluid is communicated to the platen assemblies through conventional conduits such as conduit 107. Alternate heating arrangements such as electric resistance heating are also contemplated by the present invention.

After the platen assemblies are loaded, the front and rear access doors 36, 40 are closed to seal the chamber 12 from atmosphere. A vacuum source 113, forming part of the machine (indicated schematically in FIG. 1), or alternately, a remote source, is activated to evacuate the chamber 12, thus subjecting the product to a subatmosperic pressure. By evacuating the entire chamber 12, all material in the platen assemblies is concurrently subjected to vacuum and reduces the mechanical pressure requirement as applied to the assemblies 104 by the ram 106, to achieve bonding. The lower mechanical pressure applied to the substrates reduces the chance of misregistration, dimensional changes, etc., in the finished product.

Although the machine can be loaded and unloaded through the front access opening, in the preferred operation, the platen assemblies are loaded through the front opening and unloaded through the rear opening. In particular, the materials to be laminated are placed in the platen assemblies. The front access door 36 is then closed and locked in position by the latches 37. A processing cycle is then initiated during which a predetermined pressure is applied to the platen assemblies by the ram 106. The processing chamber 12 is evacuated by a vacuum system (not shown) and the platen assemblies are heated to a predetermined temperature. The materials being laminated, the size of the board, etc. determine the processing time, the processing temperature, and the processing pressure. The process parameters can be easily changed during the cycle and varied to accommodate the requirements of particular applications. With the addition of a suitable control system, the pressure and temperature parameters can be accurately "ramped" to produce high quality circuit boards from specialized materials such as polyimide resins.

At the conclusion of a processing cycle, the laminated boards are removed from the platen assemblies. Although they can be unloaded through the front access opening, in the preferred arrangement, the process boards are removed from the platen assemblies through the rear access opening. With this preferred arrangement, the platen assemblies can be loaded substantially concurrently with the unloading operation since as product is removed through the rear access door, materials to be laminated can be immediately loaded through the front access door. As a result, relatively high throughput rates (as compared to more conventional laminating machines) can be achieved.

While the invention has been described with a certain degree of particularity it should be understood that those skilled in the art can make various changes to it without departing from the spirit or scope of the invention as hereinafter claimed.

We claim:
1. A laminating machine, comprising:
   (a) a processing unit including a frame at least partially defining a processing chamber and further defining front and rear access openings to said chamber;
   (b) a front door hingedly connected to said frame, positioned in alignment with said front opening such that upon closure of said front door, said front access opening is sealed from the ambient;
   (c) a rear door and associated opening mechanism mounted adjacent said rear access onening, said assembly comprising:
      (i) a door support including spaced track members, defining a trackway for supporting said rear door for rectilinear, planar movement between open and closed positions, said track members being pivotally connected to associated side plates forming part of said frame and operative to pivot about a common pivotal axis;
      (ii) said door support being movably connected to said processing unit and movable along a predetermined path between an adjacent and a spaced position;
      (iii) actuating means for driving said door support between said adjacent and open positions;
      (iv) door drive means operative to move said door along said trackway between said closed position at which said door is aligned with but spaced from said rear access opening when said door support is in its spaced position and an open position at which said door is positioned to one side of, and out of alignment with said opening;
      (v) said actuating means operative to drive said rear door into abutting engagement with said processing unit as said door support is moved to its adjacent position;
      (vi) seal means for providing a sealing engagement between said rear door and said processing unit whereby said rear access opening to said chamber is sealed from the ambient when door support is in its adjacent position;
   (d) evacuation means for generating a subatmospheric pressure in said chamber when said front and rear access doors are closed;
   (e) a plurality of platen assemblies disposed within said processing chamber, each platen assembly being adapted to receive a plurality of substrates to be laminated;
   (f) pressure applying means including a fluid pressure operated ram extending into said processing chamber and into pressure applying contact with said platen assemblies whereby a predetermined clamping pressure is applied to the substrates located within said platen assemblies.

2. The laminating machine of claim 1 wherein said processing chamber is further defined by upper and lower load bearing cross beams extending between said side plates.

3. The laminating machine of claim 1 further comprising heating means for heating said platen assemblies.

4. The laminating machine of claim 2 wherein said pressure applying means comprises a hydraulically operated ram extending through said lower cross beam and positioned in alignment with said platen assemblies.

5. The apparatus of claim 2 wherein said platen assemblies are oriented in a stacked relationship and located between said upper and lower cross beams.

6. A laminating machine, comprising:
   (a) a frame including side plates at least partially defining a processing chamber;
   (b) a door assembly for providing acccss to said chamber, said door assembly comprising:
      (i) door support structure pivotally connected to said frame and movable in a predetermined arc between a chamber adjacent and spaced positions;
      (ii) support actuating means for pivoting said door support between said spaced and adjacent positions;
      (iii) said door support structure slidably supporting an associated door for substantially rectilinear, planar movement;
      (iv) door actuating means for moving said door along said support structure after said support structure is pivoted to said spaced position, said door being movable between a closed position at which said door is aligned with an access opening in said chamber and an open position at which said door is located to one side and out of alignment with said access opening;
      (v) said actuating means further operative to clamp said door into sealing engagement with sealing surfaces defined by said frame such that said chamber is substantially sealed from atmosphere when said door is in its closed position and said door support structure is in its adjacent position;
      (vi) said door support being pivotally mounted to said frame by a pivot structure located below said access opening and said actuating means for said support being located above said access opening such that said door support applies a clamping pressure to said door when said door is in its closed position and said door support is moved to its chamber adjacent position.

* * * * *